United States Patent
Kim et al.

(10) Patent No.: US 7,802,579 B2
(45) Date of Patent: Sep. 28, 2010

(54) APPARATUS AND METHOD FOR TREATING SUBSTRATES

(75) Inventors: Hyun-Jong Kim, Chungcheongnam-do (KR); Kyo-Woog Koo, Chungcheongnam-do (KR); Jung Keun Cho, Seoul (KR)

(73) Assignee: Semes Co., Ltd. (KR)

( * ) Notice: Subject to any disclaimer, the term of this patent is extended or adjusted under 35 U.S.C. 154(b) by 458 days.

(21) Appl. No.: 11/809,169

(22) Filed: May 31, 2007

(65) Prior Publication Data
US 2008/0057219 A1 Mar. 6, 2008

(30) Foreign Application Priority Data
Aug. 30, 2006 (KR) .................. 10-2006-0082799

(51) Int. Cl.
*B08B 3/00* (2006.01)
(52) U.S. Cl. ..................... 134/94.1; 134/95.2
(58) Field of Classification Search ............... 134/94.1, 134/95.1–95.3, 172, 198, 200; 239/449, 239/518, 522, 523, 524, 589, 589.1
See application file for complete search history.

(56) References Cited
U.S. PATENT DOCUMENTS
6,164,297 A * 12/2000 Kamikawa ............... 134/61
6,315,858 B1 * 11/2001 Shinozuka et al. ..... 156/345.33
6,394,110 B2 * 5/2002 Kamikawa et al. ........... 134/61
2008/0014358 A1 * 1/2008 Koo et al. ................ 427/372.2

FOREIGN PATENT DOCUMENTS
| JP | 9275089 A | 10/1997 |
| JP | 10-106999 | * 4/1998 |
| JP | 11265873 A | 9/1999 |
| JP | 11304361 A | 11/1999 |
| JP | 2001196344 A | 7/2001 |
| JP | 2003-280218 A | 10/2003 |
| JP | 2003-338450 | * 11/2003 |
| JP | 2004254830 A | 9/2004 |
| KR | 2002-44536 | 6/2002 |

* cited by examiner

*Primary Examiner*—Michael Kornakov
*Assistant Examiner*—Stephen Ko
(74) *Attorney, Agent, or Firm*—Jenkins, Wilson, Taylor & Hunt, P.A.

(57) ABSTRACT

A substrate treating apparatus includes a substrate support unit with a chuck on which a substrate is loaded; a bottom chamber having an open top and configured to surround the circumference of the chuck; a top chamber configured to open or close the top of the bottom chamber such that the substrate is dried while the top chamber is sealed from the outside; and a direct injection nozzle member installed at the top chamber to inject fluid directly to the substrate while the top of the bottom chamber is closed. According to the substrate treating apparatus, drying efficiency of an entire substrate is enhanced, external contaminants are blocked, and generation of an oxide layer is suppressed.

12 Claims, 11 Drawing Sheets

APPARATUS AND METHOD FOR TREATING SUBSTRATES

CROSS-REFERENCE TO RELATED APPLICATIONS

This U.S. non-provisional patent application claims priority under 35 U.S.C §119 of Korean Patent Application 2006-82799 filed on Aug. 30, 2006, the entirety of which is hereby incorporated by reference.

BACKGROUND

The present invention relates to substrate treating apparatuses. More specifically, the present invention is directed to a substrate treating apparatus in which chemical or gas is supplied to a top surface of a substrate to clean and dry the substrate and a substrate treating method using the substrate treating apparatus.

In manufacturing semiconductor devices, the arrangement of fine patterns is made by repeatedly depositing and etching an insulating layer and a metallic material, coating and developing photoresist, and removing an asher. Particles generated during these processes are removed by means of a wet cleaning process using deionized water (DI water) or chemical.

A conventional cleaning and drying apparatus includes a wafer chuck provided to hold a wafer. While a wafer held by the wafer chuck is rotated by a motor, DI water or a chemical is supplied to a surface of the wafer. Due to a rotatory force of the wafer, the supplied DI water or chemical spreads out the entire surface of the wafer to perform a cleaning and drying process.

In such a single-wafer cleaning and drying apparatus, a wafer is rinsed using DI water and the rinsed wafer is dried using $N_2$ gas.

However, with the recent trend toward larger-diameter wafers and finer patterns formed on a wafer, DI water may not be fully removed (undried). Since a wafer is cleaned and dried while being exposed to the air, an external environment has a great effect on the wafer to cause poor drying of the wafer.

Especially, a conventional cleaning and drying apparatus has an exhaust structure formed at the bottom of a chamber. In spite of the exhaust structure, fumes generated over a substrate during the cleaning and drying of a substrate are not drained smoothly. Thus, the fumes result in contamination of the substrate.

SUMMARY OF THE INVENTION

Exemplary embodiments of the present invention provide a substrate treating apparatus. In an exemplary embodiment, the substrate treating apparatus may include: a substrate support unit with a chuck on which a substrate is loaded; a bottom chamber having an open top and configured to surround the circumference of the chuck; a top chamber configured to open or close the top of the bottom chamber such that the substrate is dried while being isolated from the outside; and a direct injection nozzle member installed at the top chamber to inject fluid directly to the substrate while the top of the bottom chamber is closed.

Exemplary embodiments of the present invention provide a substrate treating method. In an exemplary embodiment, the substrate treating method may include: loading a substrate on a chuck disposed at the inner side of a bottom chamber; injecting cleaning fluid to the substrate to clean the substrate; injecting rinsing fluid to the substrate to rinse the substrate; and injecting drying fluid to the substrate to dry the substrate, wherein in the injecting the drying fluid to the substrate, a direct injection nozzle member installed at the top chamber injects the drying fluid directly to the substrate to dry the substrate while the bottom chamber is sealed by the top chamber.

DETAILED DESCRIPTION OF PREFERRED EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
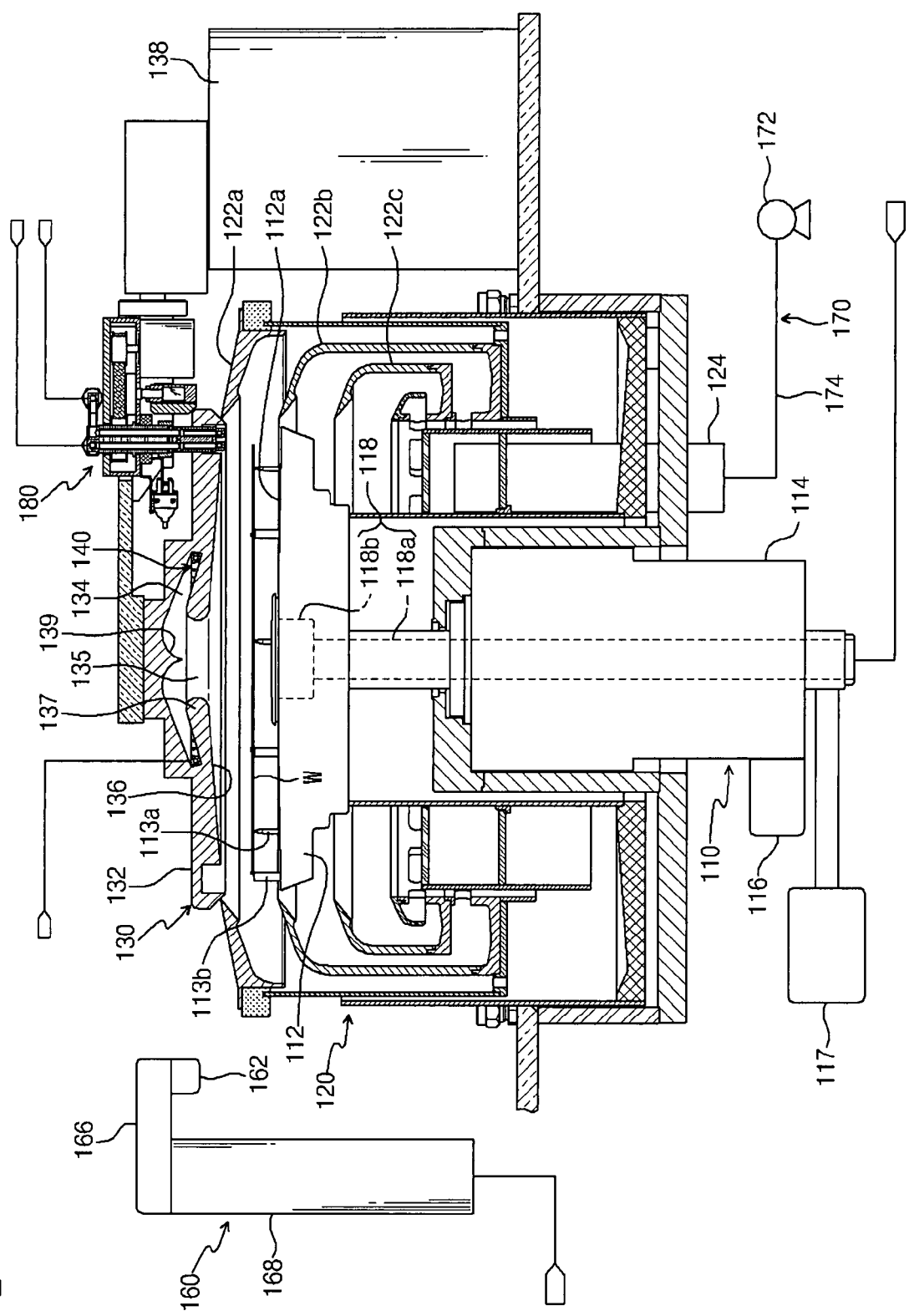
FIG. 1 illustrates a substrate treating apparatus in which a bottom chamber is fully sealed.
Figure 2:
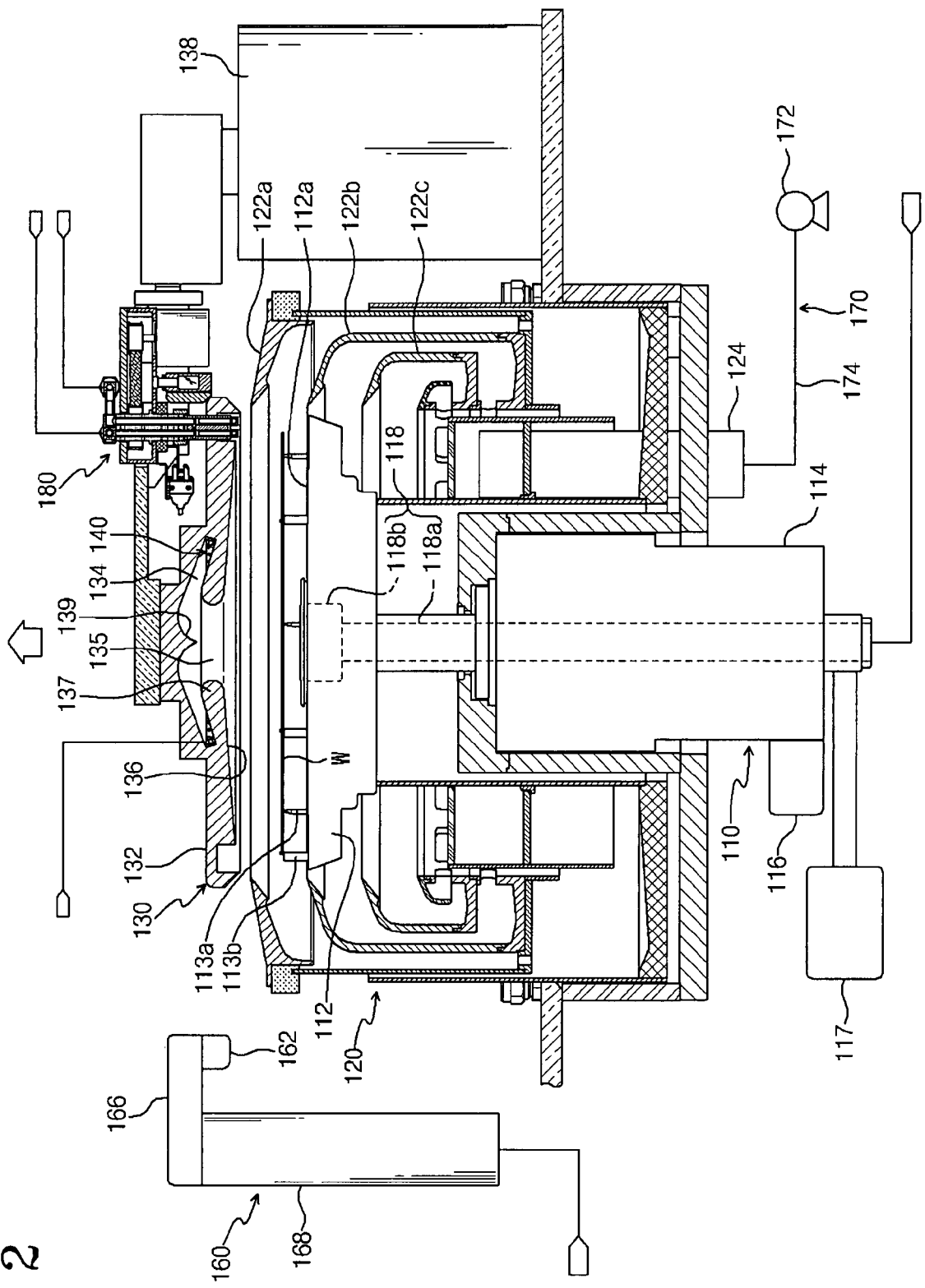
FIG. 2 illustrates a substrate treating apparatus in which a bottom chamber is partially sealed.

FIG. 1 illustrates a substrate treating apparatus in which a bottom chamber is fully sealed, and FIG. 2 illustrates a substrate treating apparatus in which a bottom chamber is partially sealed. Further, FIG. 3 illustrates a substrate treating apparatus in which a bottom chamber is fully open.

Figure 3:
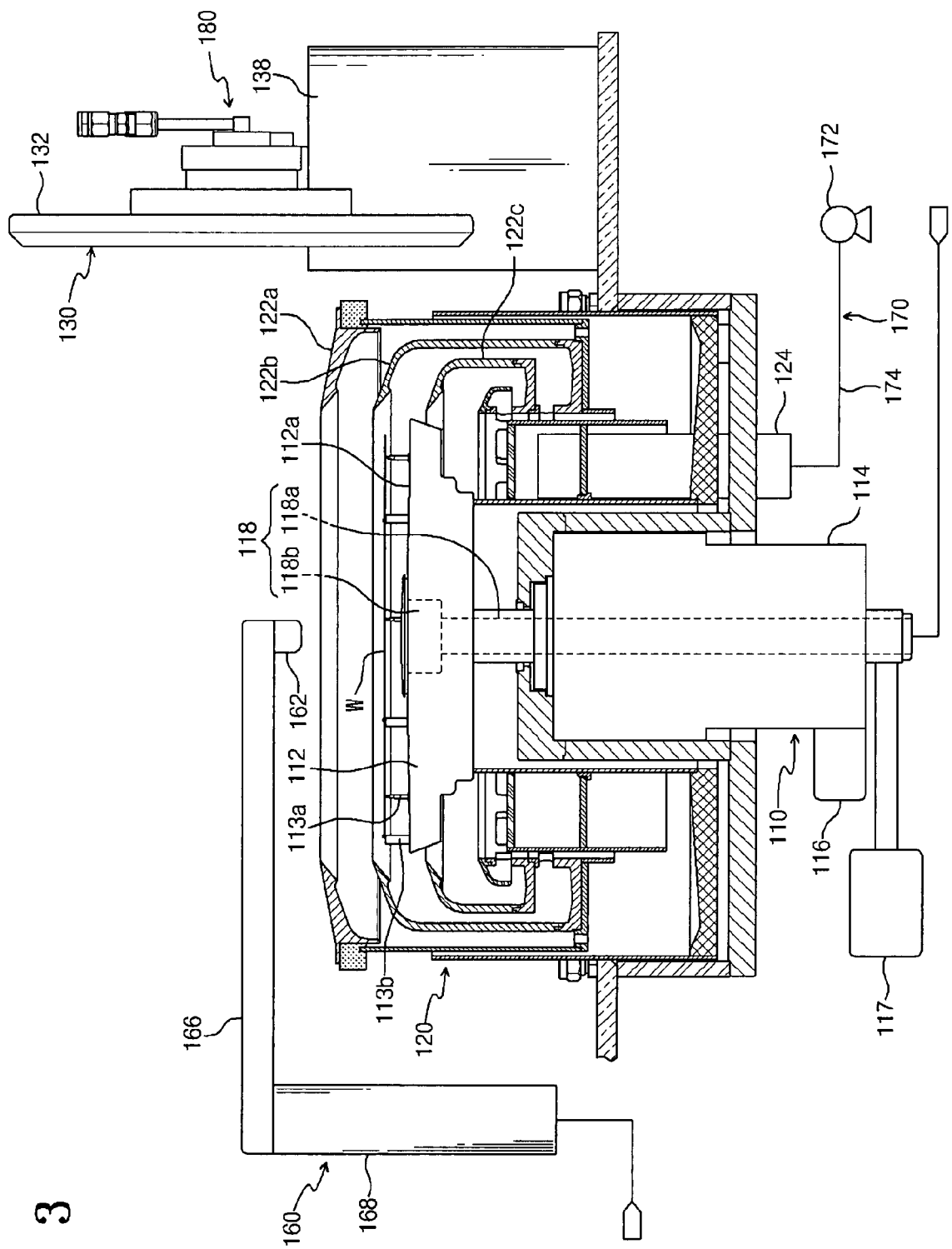
FIG. 3 illustrates a substrate treating apparatus in which a bottom chamber is fully open.
Figure 4:
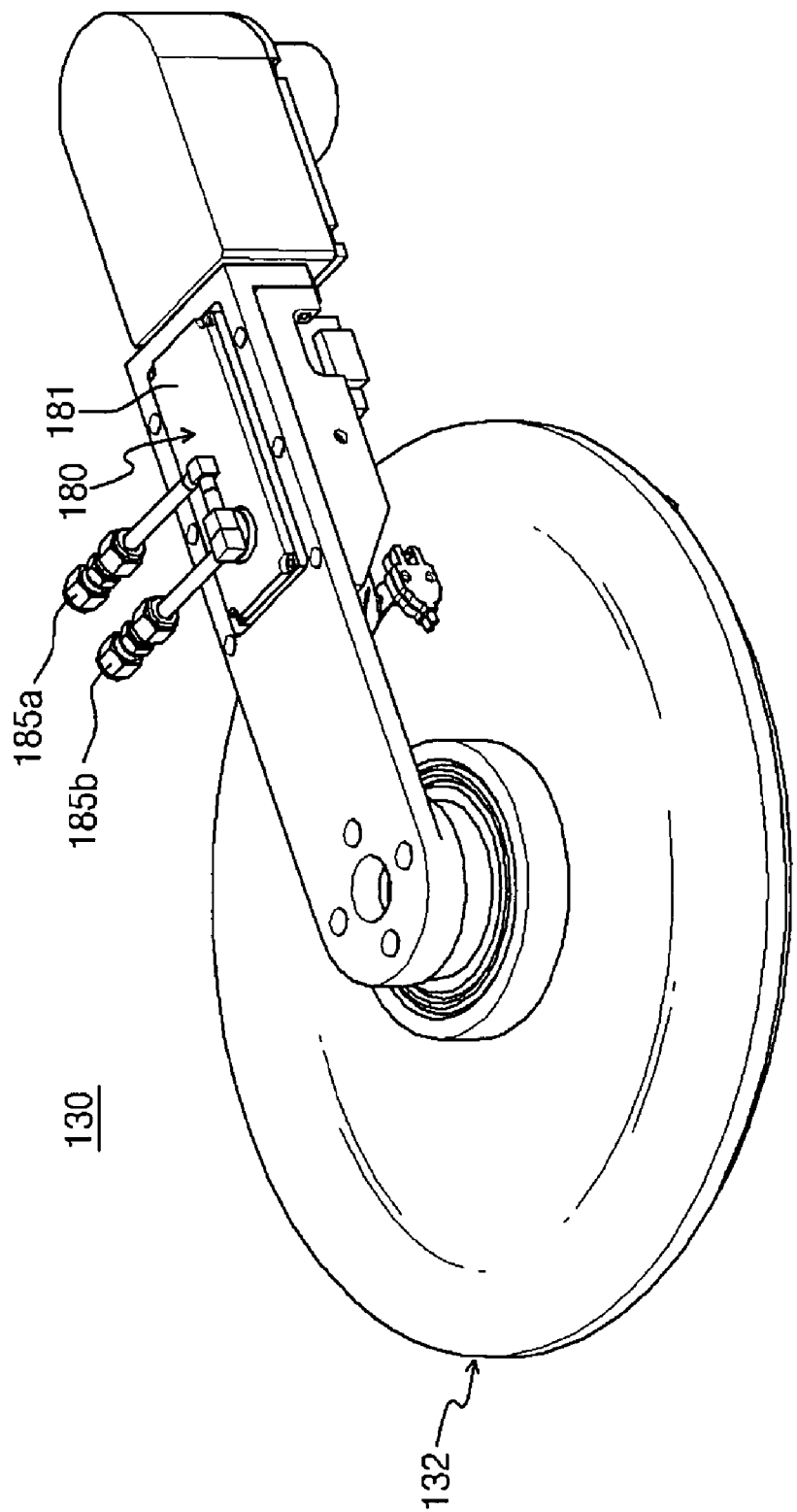
FIG. 4 is a perspective view of a top chamber where a direct injection nozzle member is installed.
Figure 5:
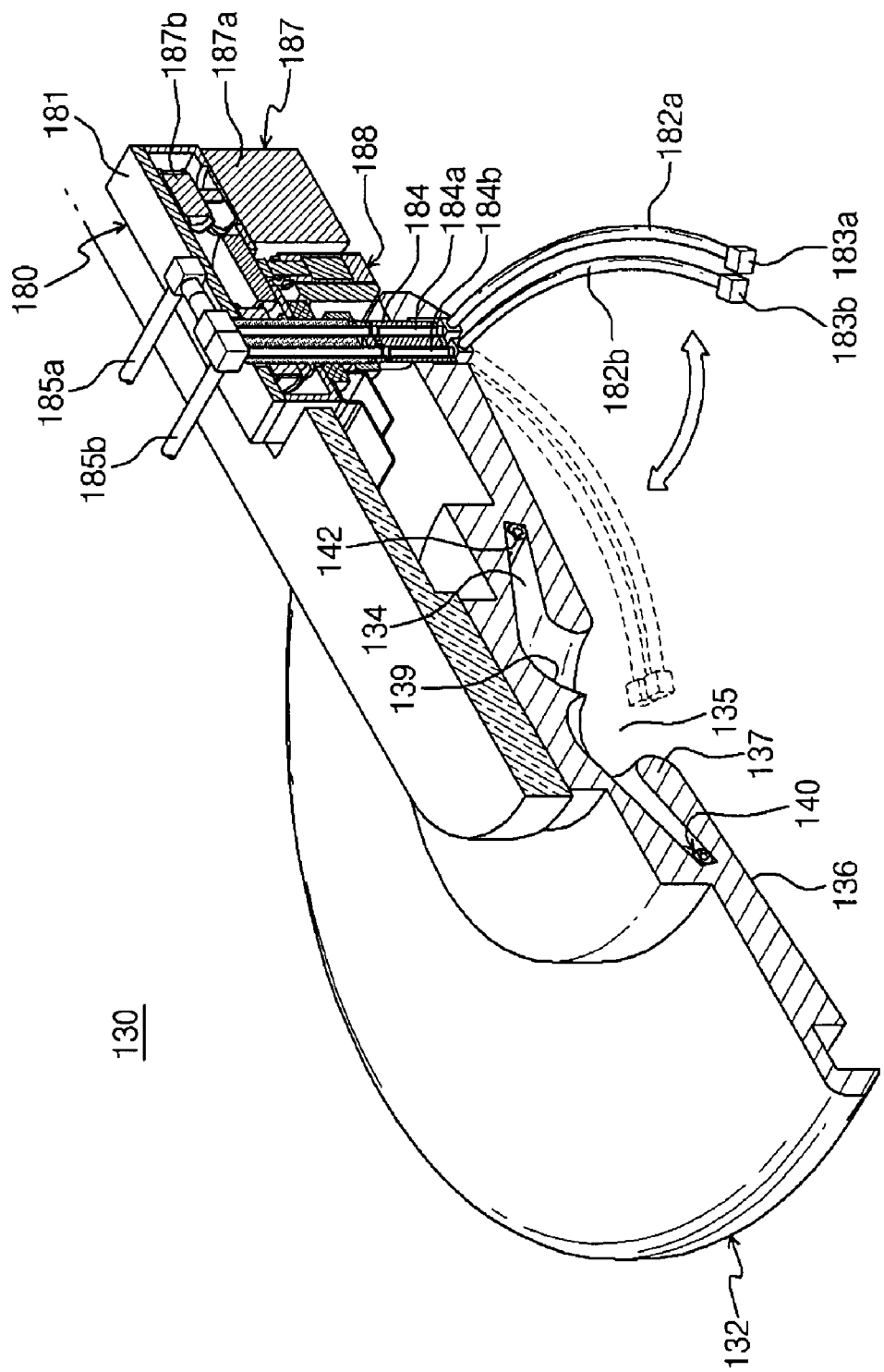
FIG. 5 is a partially sectioned perspective view of a top chamber where a direct injection nozzle member is installed.
Figure 6:
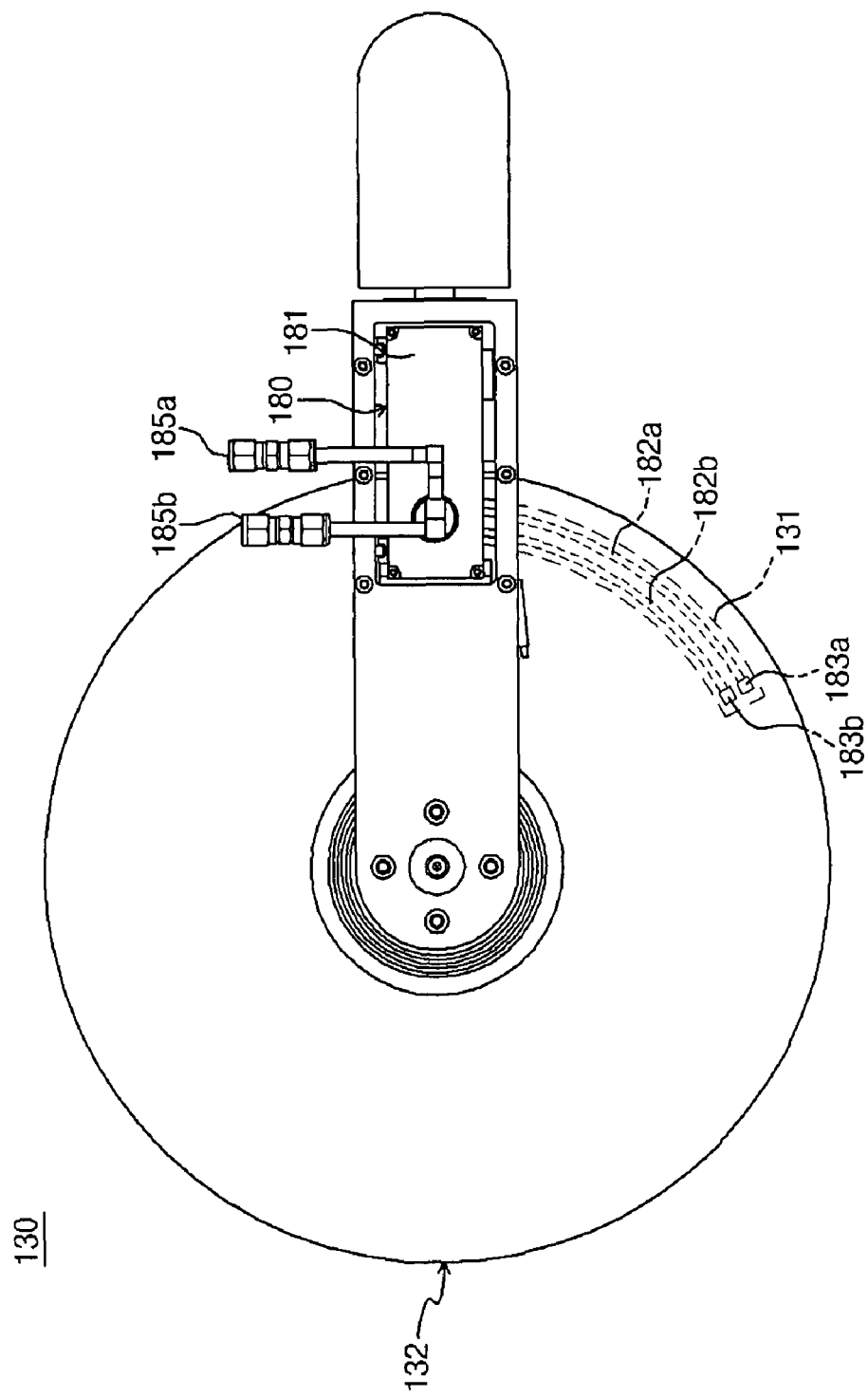
FIG. 6 is a plane view of a top chamber where a direct injection nozzle member is installed.
Figure 7:
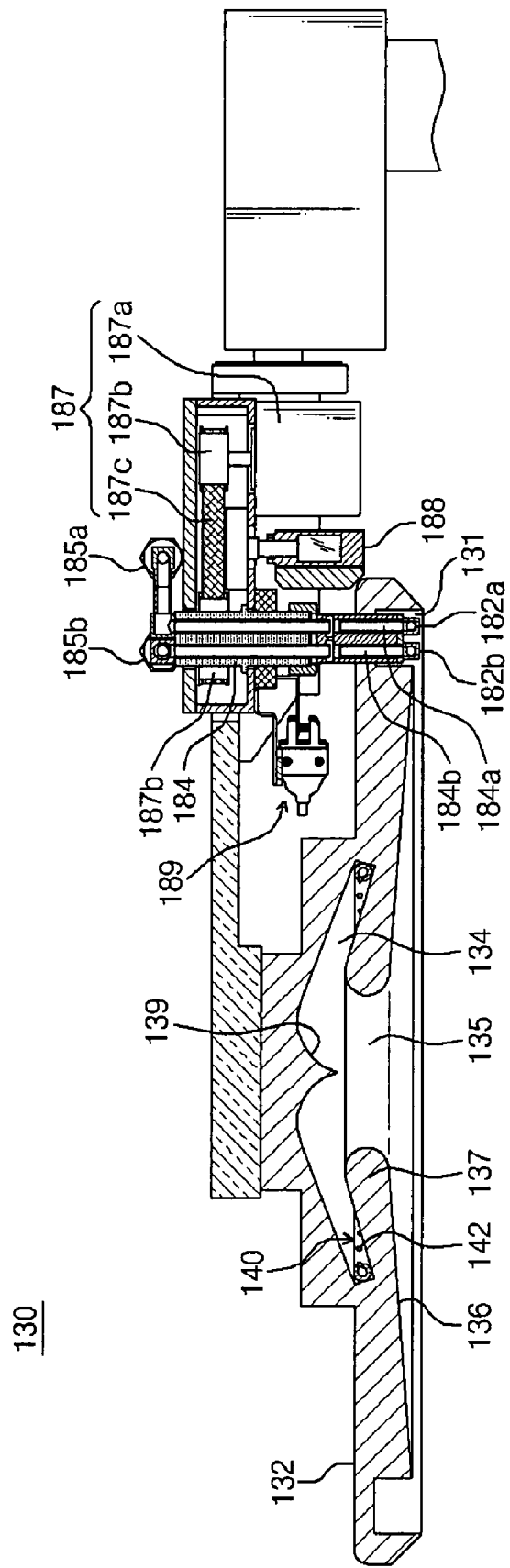
FIG. 7 is a cross-sectional view of a top chamber where a direct injection nozzle member is installed.
Figure 8:
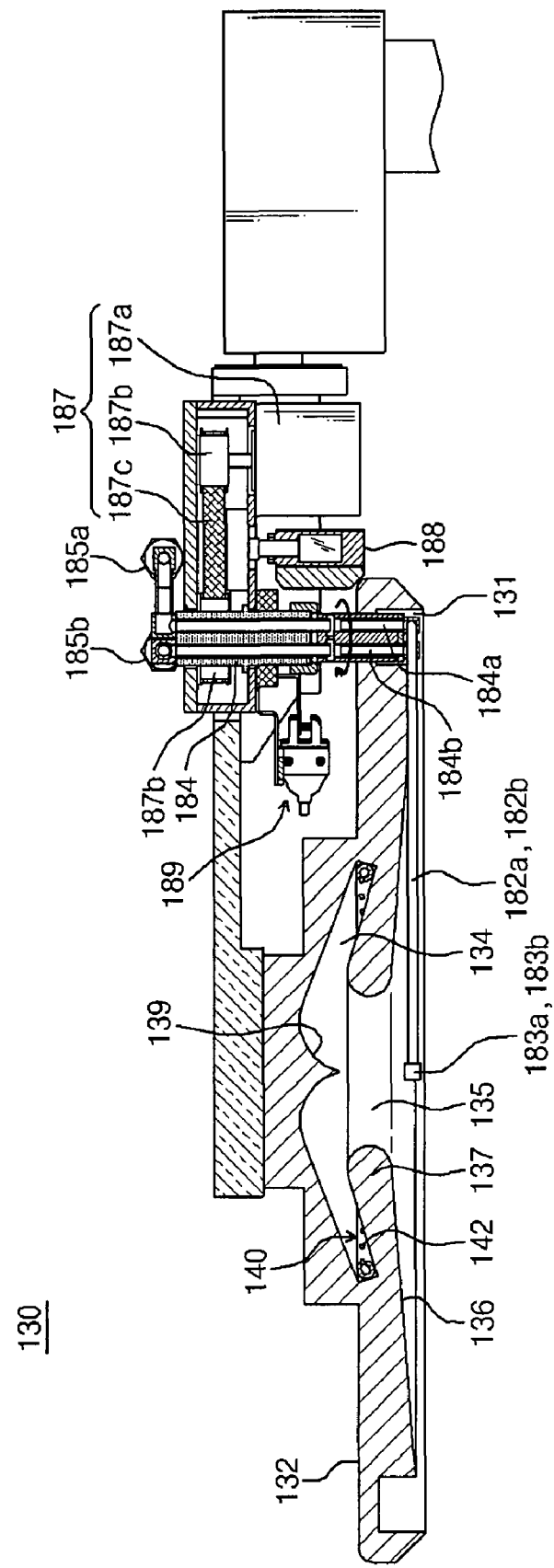
FIG. 8 is a cross-sectional view of a top chamber, which shows the state that first and second nozzles of the direct injection nozzle member rotate in FIG. 7.

Referring to FIGS. 1 through 3, a substrate treating apparatus 100 successively performs treating processes such as a chemically cleaning process, a rinsing process, and a drying process.

The substrate treating apparatus 100 includes a substrate support unit 110, a bottom chamber 120, a top chamber 130, and a chemical nozzle unit 160, and a decompress unit 170.

The substrate support unit 110 is configured to support a substrate W during a treating process and includes the chuck 112, a spindle 114, a rotation member 116, and an elevating member 117, and a back nozzle part 118.

The chuck 112 is disposed inside the bottom chamber 120. The chuck 112 has a top surface 112a on which a substrate W is loaded, support pins 113a for supporting the substrate W while being spaced apart from the top surface 112a, and chucking pins 113b for fixing the substrate W. The chucking pins 113b chuck a part of the edge of the substrate W during a process.

The spindle 114 is coupled with the central bottom of the chuck 112. The spindle 114 is provided in the form of a hollow shaft for transferring a rotatory force of the rotation member 116 to the chuck 112. Although not illustrated in detail, the rotation member 116 may include a driver such as a motor for generating a rotatory force, a power transfer unit such as a belt and a chain for transferring the rotatory force generated from the driver to the spindle.

The elevating member 117 allows the chuck 112 to move up and down such that a height of the chuck 112 varies with the kind of fluid for use in a process (or varies with treating processes) inside the bottom chamber 120. Due to the elevating member 117, the chuck 112 is carried at heights corresponding to first, second, and third suction ducts 122a, 122b, and 122c (which will be described later) according to the kind of fluid used (or according to treating processes). As described in the above embodiment, the bottom chamber 120 is fixed and the chuck 112 moves up and down according to the processes such as cleaning, rinsing, and drying processes (or according to the kind of fluid used). On the contrary, the bottom chamber 120 may move up and down while the chuck 112 is fixed.

The back nozzle part 118 is configured to selectively inject fluid for cleaning and drying a substrate W to the bottom of the substrate W. The back nozzle part 118 includes a supply pipe 118a and a nozzle 118b. The supply pipe 118 functions as a flow passage of fluid flowing a hollow section of the spindle 114, and the nozzle 118b installed on the center of the top surface of the chuck 112. The nozzle 118b is connected to the supply pipe 118a to be exposed to a central portion of the chuck 112, injecting fluid to the rear surface of the substrate W to clean and dry the rear surface of the substrate W. The supply pipe 118a may be a predetermined pipe or an empty space defined in the form of an inner pipe of the spindle 114. The fluid injected to the center of the rear surface of the substrate W through the nozzle 118b is readily dispersed to the edge of the substrate W by the rotation of the substrate W.

The bottom chamber 120 has an open top and is configured to surround the circumference of the chuck 112. The first, second, and third suction ducts 122a, 122b, and 122c are arranged stepwise and are annular suction ducts provided such that fluid dispersed on a rotating substrate W (or fumes generated while a substrate W is chemically treated) flows in. Each of the suction ducts 122a, 122b, and 122c has an exhaust port 124 connected to a vacuum line 174 for forcibly exhausting the fluid. Drain lines (not shown) are connected to the bottom chamber 120 for recovering chemicals.

The decompress unit 170 is provided to decompress a sealed treat space "a" defined by coupling the bottom chamber 120 with the top chamber 130. The decompress unit 170 includes a vacuum pump 172 and a vacuum line 174 having one end connected to the vacuum pump 172 and the other end connected to the exhaust port 124 of the bottom chamber 120.

Referring to FIG. 1, and FIGS. 4 through 8, the top chamber 130 includes an upper cup 132 for opening or closing the top of the bottom chamber 120, an indirect injection nozzle member 140 installed at the upper cup 132 for indirectly injecting fluid for drying a substrate W to the substrate W, an open/close driver 138 for moving the upper cup 132 to fully open, partially close, and fully close the top of the bottom chamber 120, and a direct injection nozzle member 180 installed at the upper cup 132 for directly injecting fluid for rinsing and drying the substrate W to the substrate W.

The upper cup 132 is sized enough to fully cover the top of the bottom chamber 120 and has an annular space 134, a guide protrusion 139, a central aperture 135, a guide surface 136, and a protrusive wall 137.

The annular space 134 is an umbrella-shaped space including an edge portion where the indirect injection nozzle member 140 is installed and a central portion higher than the edge portion. The annular space 134 has an inclined passage for guiding the drying fluid injected from the indirect injection nozzle member 140 to the central portion.

The guide protrusion 139 is an flow induction member for guiding the flow of drying fluid, enabling the drying fluid injected from the indirect injection nozzle member 140 to reach first the center of the substrate W. The guide protrusion 139 exhibits the shape of a cone protruded toward the center of the substrate W from the upper center of the upper cup 132. If the guide protrusion 139 is not provided, the drying fluid injected from the indirect injection nozzle collides to cause a non-uniform flow of the drying fluid. Accordingly, the guide protrusion 139 serves to prevent the collision of the drying fluid in the upper center of the upper cup 132.

The indirect injection nozzle member 140 may be provided in the form of a ring installed at the edge portion of the annular space 134. The indirect injection nozzle member 140 includes a plurality of injection holes 142 spaced at regular intervals. Each of the injection holes 142 is formed to inject drying fluid in an upward direction (direction of the guide protrusion 139). The drying fluid flows to the guide protrusion 139 disposed at a center portion 134b of the annular space 134 along the annular space 134 after being injected through the injection holes 142 of the indirect injection nozzle 140.

The drying fluid collected at the center portion 134b of the annular space 134 is drained to a treat space "a" through the central aperture 135 by the guide protrusion 139. The protrusive wall 137 is a protrusive portion between the treat space "a" and the annular space 134 where the drying fluid injected from the indirect injection nozzle member 140 flows. The protrusive wall 137 protects a substrate W from foreign substances dropping from the indirect injection nozzle member 140.

Note that the drying fluid may include an organic solvent (IPA) and nitrogen gas, which are heated at a temperature ranging from 30 to 90 degrees centigrade.

As described above, drying fluid is indirectly injected to entirely maintain a laminar flow and a concentration distribution of the drying fluid is maintained more uniformly than using a conventional swing nozzle configured to directly inject fluid to a substrate surface. The indirect injection nozzle member 140 is disposed at the edge portion (inwardly dent portion) of the annular space 134 to prevent foreign substances dropping from the injection holes 142 of the indirect injection nozzle 140 from dropping onto a substrate W. Especially, since the drying fluid flows stably to the center portion of the substrate W after being collected at a center portion of the upper cover 132, the substrate W is uniformly dried.

The guide surface 136 of the upper cup 132 is inclined downwardly from its center to its edge. The guide surface 136 guides drying fluid drained through the central aperture 135 such that the drying fluid flows while being diffused gradually to the edge from the center of the substrate W. Due to the downwardly inclined guide surface 136, the concentration of the drying fluid is not lowered even when the drying fluid flows to the edge from the center of the substrate W. The guide surface 136 defines a treat space "a" tapered to the edge from the center of the substrate W.

Since the treat space "a" is tapered to the edge from the center of the substrate W, the concentration of the drying fluid flowing to the edge from the center of the substrate W is higher at the edge of the substrate W than at the center of the substrate W. Further, since the drying fluid flows to the edge from the center of the substrate W while being diffused gradually, it is uniformly provided onto the entire surface of the substrate W.

Since a fluid flow passage, i.e., the treat space "a" is narrowed from the center to the edge of the substrate W, a flow rate of the drying fluid is higher at the edge of the substrate W than at the center of the substrate W. Accordingly, it may be possible to enhance removing efficiency of particles and water remaining on the surface of the substrate W.

Referring to FIGS. 4 through 8, the direct injection nozzle member 180 is provided to directly inject drying fluid to a substrate. Due to the direction injection nozzle 180, undried portions of the top surface of the substrate are additionally dried individually and a substrate drying efficiency is enhanced. Especially, the direct injection nozzle member 180 aids a drying of the center of the substrate that is not completely dried by the indirect injection nozzle member 140. The direct injection nozzle member 180 pushes the drying fluid from the center to the edge of the substrate to directly dry the surface of the substrate.

The direct injection nozzle member 180 includes first and second nozzles 182a and 182b, a shaft 184, a first driver 187, and a second driver 188. The first and second nozzles 182a and 182b are arranged abreast on the bottom surface of the upper cup 132. The first and second nozzles 182a and 182b have nozzle tips 183a and 183b at one end, respectively. Injection holes are formed at the nozzle tips 183a and 183b to inject deionized water (DI water) and drying fluid, respectively. The other ends of the nozzle 182a and 182b are connected to the shaft 184. The first and second nozzles 182a and 182b are provided as a curved shape and stay in an accommodating space 131, defined at the bottom surface of the edge of the upper cup 132, so as not to block other processes. For example, the first and second nozzles 182a and 182b may be provided as a arc shape. The accommodating space 131 is disposed at the position spaced apart from the edge of the substrate to prevent flow unbalance and interference caused by the first and second nozzles 182a and 182b during other processes. While the first and second nozzles 182a and 182b exhibit a curved shape, they may exhibit a variety of shapes such as a straight line.

The shaft 184 is perpendicularly disposed to penetrate the upper cup 132 and supported by a bracket 181. The shaft 184 rotates by means of the first driver 187 and moves up and down by means of the second driver 188. The shaft 184 has first and second passages 184a and 184b through which DI water and drying fluid are supplied to the first and second nozzles 182a and 182b respectively and ports 185a and 185b to which a rinse fluid supply line 198a and a drying fluid supply line 198b are connected respectively. The shaft 184 is configured to rotate at the bracket 181.

The first driver 187 allows the first and second nozzle 182a and 182b to move horizontally and includes a motor 187a for generating a rotatory force, a pulley 187b for transferring the rotatory force generated from the motor 187 to the shaft 184, and a belt 187c. The second driver 188 allows the first and second nozzles 182a and 182b to move up and down. The up-and-down movement of the first and second nozzles 182a and 182b is done to be accommodated in the accommodating space 131, and to regulate their injection heights. The direct injection nozzle member 180 includes a sensor 189. The sensor 189 detects rotation angle and height of the shaft 184 to prevent a bad process caused by the malfunction of the first and second drivers 187 and 189.

According to the above-described substrate treating apparatus 100, the direct injection nozzle member 180 injects drying fluid directly to specific portions (central portion, edge portion, etc.) undried even by the indirect injection nozzle member 140 to enhance a substrate drying efficiency.

In addition, a treat space "a" of a substrate W is isolated from the outside by the top chamber 130, and the isolated treat space "a" may be decompressed below an atmospheric pressure. Therefore, an external environment has a minimal effect on a substrate drying process and a substrate is dried fast.

Although not illustrated in figures, the bottom chamber 120 and the chuck 112 of the substrate support unit 110 may be elevated relatively or individually. While the bottom chamber 120 and the chuck 112 are ascended or descended, a substrate W may be loaded on the chuck 112 or a treated substrate W may be unloaded therefrom.

Referring to FIGS. 1 and 3, the chemical nozzle unit 160 is provided to inject cleaning fluid and rinsing fluid to the top surface of a substrate W. The chemical nozzle unit 160 includes a chemical nozzle 162, which straightly moves up and down or rotatively moves to the outside of the bottom chamber 120 from the topside of the center of a wafer W by means of a nozzle moving member 164. The nozzle moving member 164 includes a horizontal support 166 to which the chemical nozzle 162 is connected and a vertical support 168 which is connected to the horizontal support 166 and rotatable by means of a motor (not shown).

According to the above-described substrate treating apparatus 100, the number of injection holes or the kind of fluids supplied to the injection holes may vary with methods for cleansing and drying substrates. Moreover, intervals of the injection holes may vary. For example, cleaning fluid may be a mixed solution of DI water and HF or a mixed solution of DI water, ammonia solution, and hydrogen peroxide solution; rinsing fluid may be DI water; and drying fluid may be a mixed gas of IPA vapor and nitrogen gas or nitrogen gas.

A method for cleaning and drying substrate using the foregoing substrate treating apparatus will now be described below in detail.

Figure 9:
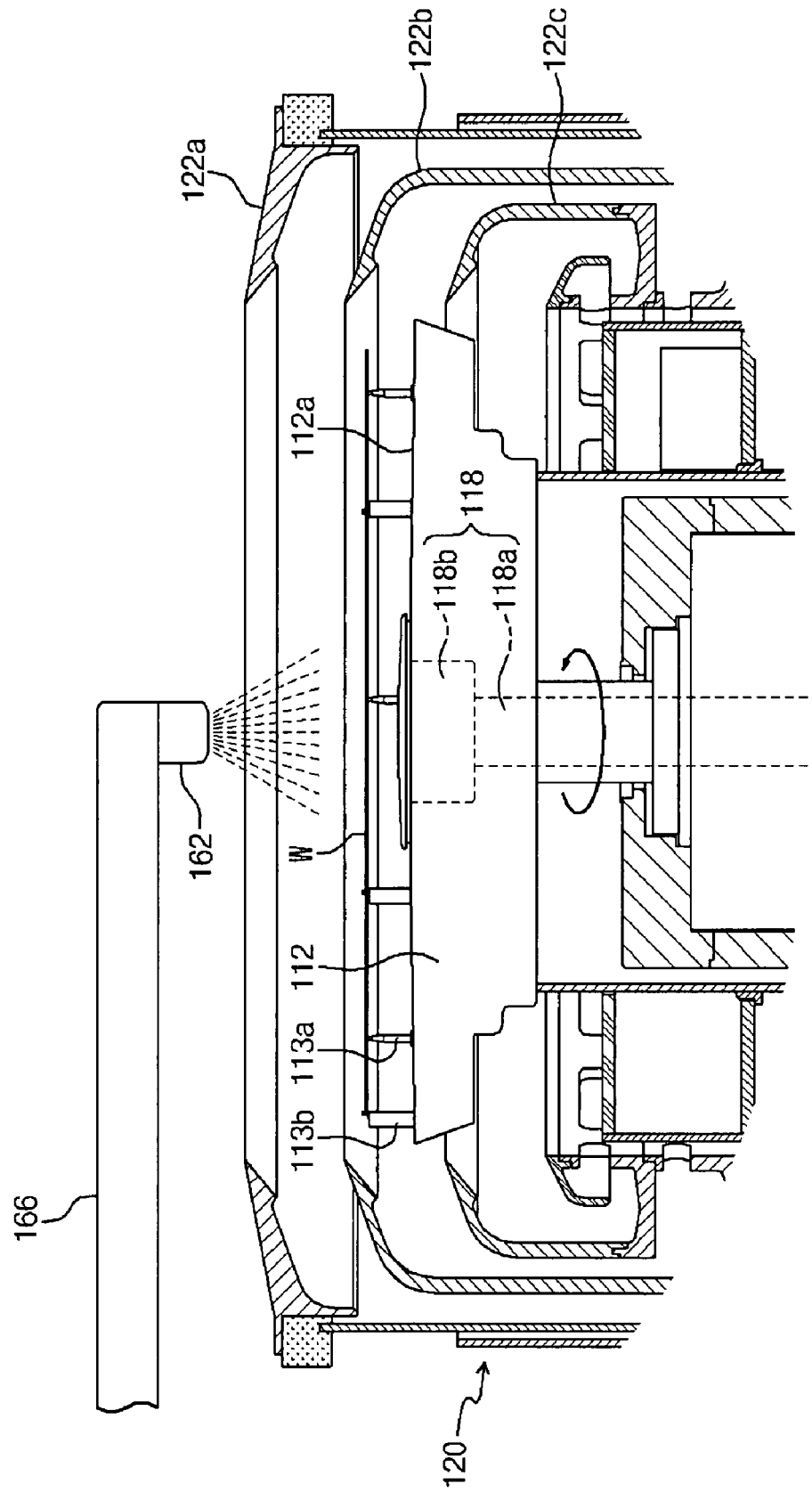
FIGS. 9 through 11 illustrate the steps of treating a substrate using a substrate treating apparatus.

Referring to FIG. 9, a substrate W is loaded on a chuck 122 through the open top of a bottom chamber 120. While the substrate W is supported by support pins 113a, it is chucked by chucking pins 113b. The substrate W rotates with the chuck 112 by means of the operation of a rotation member 116. The rotating substrate W is cleaned and rinsed by the fluid injected through a chemical nozzle 162 of a chemical nozzle unit 160. The cleaning and rinsing are done while a top chamber is fully open.

When the cleaning operation for the substrate W is completed, a drying operation for the substrate W is started. The drying operation is conducted under the condition below atmospheric pressure just after injecting DI water to the surface of the substrate W to form a protective layer for preventing formation of watermarks at the surface of the substrate W.

Figure 10:
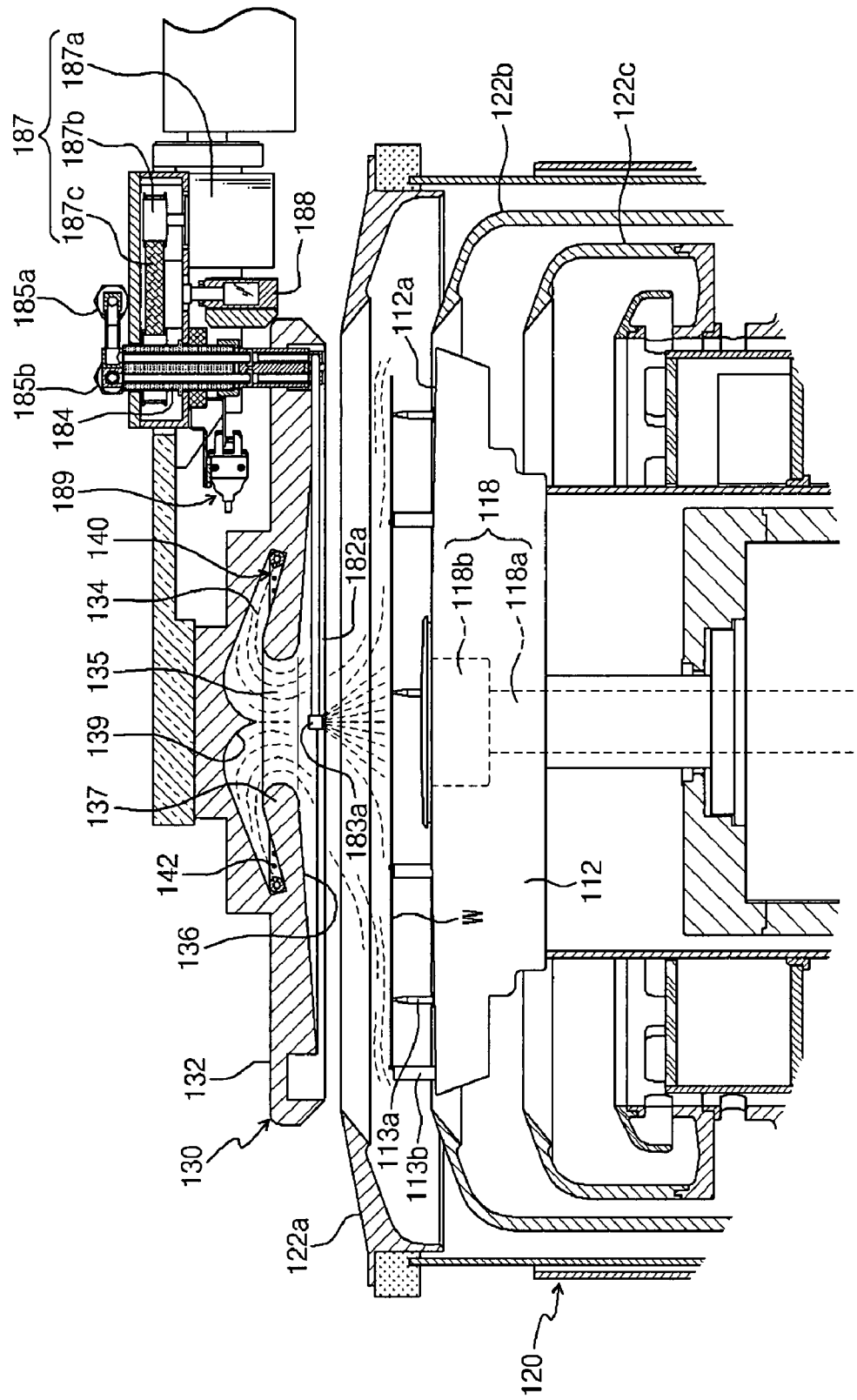

The drying operation will now be described below in detail. Referring to FIG. 10, an upper cup moves to a partially sealing position from a fully open position to seal a bottom chamber. At this point, a direct injection nozzle member moves first and second nozzles to the topside of the center of the substrate such that the surface of the substrate is not exposed to the air, and DI water is injected to the surface of the substrate through the first nozzle to form a protective layer on the surface of the substrate. When the DI water is injected to the surface of the substrate, the substrate is stopped or rotates at a low speed ranging from 1 to 30 rpm. That is, the substrate rotates at a low speed such that the DI water is not dispersed out by a centrifugal force. When the upper cup moves to a partially sealing position, a dry atmosphere is established inside the upper cup by drying fluid injected from an indirect injection nozzle member.

Figure 11:
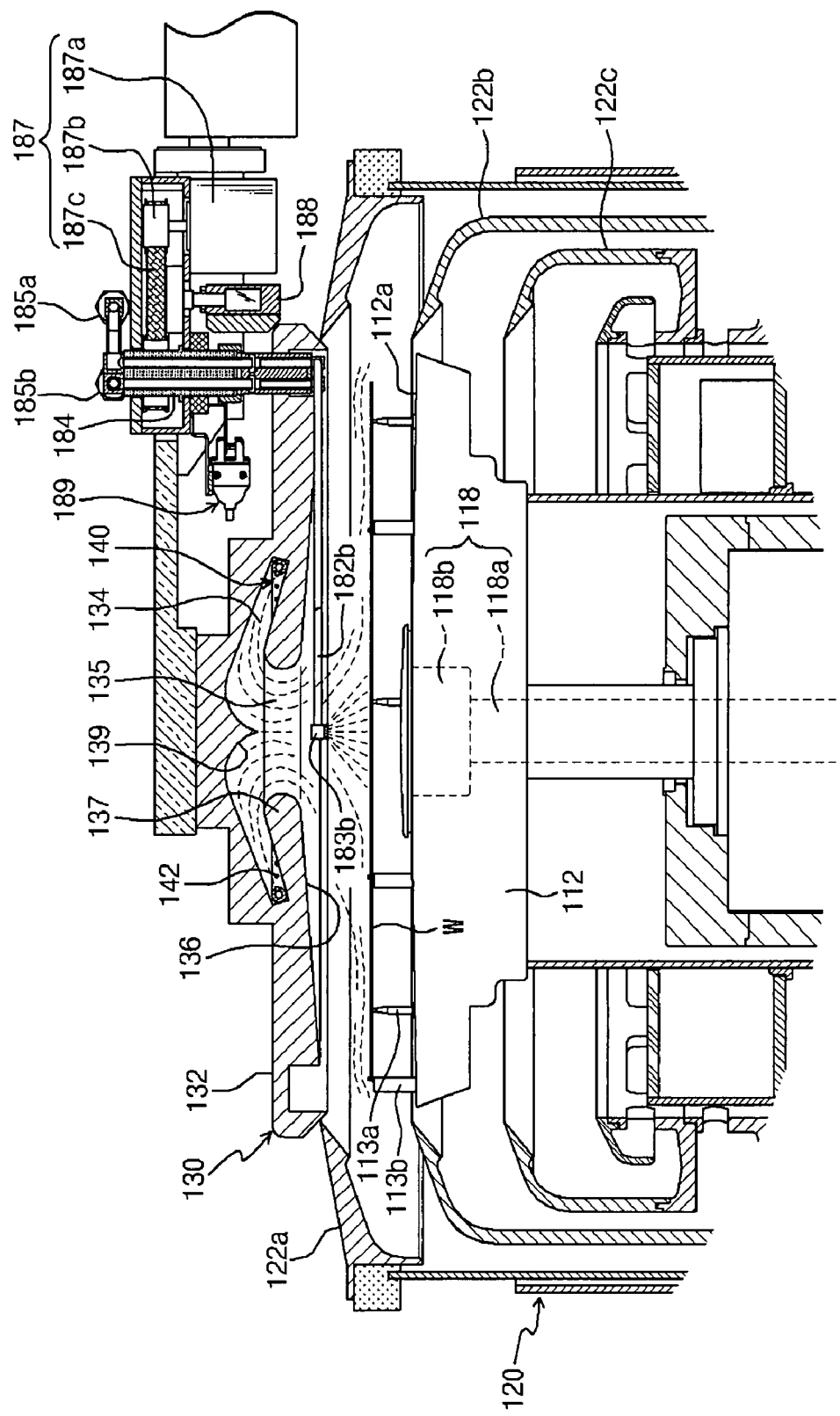

After forming the protective layer of DI water, the upper cup moves secondarily to a fully sealing position from the partially sealing position to close the bottom chamber (see FIG. 11). Referring to FIG. 11, a treat space "a" sealed by the upper cup is decompressed below the atmospheric pressure by a decompress part 170. When the treat space "a" is decompressed below the atmospheric pressure, the substrate W is dried by the drying fluid indirectly injected through an indirect injection nozzle member 140 and the drying fluid directly injected through a second nozzle of a direct injection nozzle member 180. The drying fluid is supplied through the indirect injection nozzle member 140 from the time before the treat space "a" is decompressed (from the point of time when the top chamber moves to seal the bottom chamber). The indirect injection nozzle 140 is disposed at the edge portion of the annular space 134, and the injection hole 142 faces upwardly to prevent the substrate contamination caused by foreign substances dropping from the injectin hole 142. The drying fluid is collected at a central portion 134b of an annular space 134 (the center of the upper cup) along the annular space 134 after being injected through injection holes 142 of the indirect injection nozzle member 140. The drying fluid collected in the central portion of the annular space 134 flows to a substrate central portion of the treat space "a" through a central aperture 135. The drying fluid flowing to the substrate central portion through the central aperture 135 is gradually diffused from the center to the edge of a rotating substrate W to dry the top surface of the substrate W uniformly and fast.

The direct injection nozzle member 180 pushes the drying fluid from the center to the center of the substrate to directly dry the surface of the substrate. While the direct injection nozzle member 180 moves to the edge from the center of the substrate W, the drying fluid is injected to the edge from the center of the substrate W while being diffused. Optionally, a direct injection nozzle may be controlled to intensively inject drying fluid to a specific portion where a poor drying occurs.

According to the present invention, top and bottom surfaces of a substrate W are cleaned and dried at the same time. Specifically, the bottom surface of a substrate is cleaned and dried by supplying the same fluid as fluid, supplied to the top of the substrate W, to the bottom surface of the substrate W through a nozzle 152 of a back nozzle part 150 while the substrate W spins.

When the drying of the substrate W is completed, the upper cup 132 of the top chamber 130 moves to the fully open position shown in FIG. 9 after moving up to the partially sealing position shown in FIG. 10 to open the top of the bottom chamber 120. The substrate W is unloaded from the chuck 112 while the chuck 112 is stopped.

The present invention may be applied to all apparatuses for treating substrates using liquid (or gas). While a rotary cleaning apparatus for use in a semiconductor cleaning process has been described in the foregoing embodiments of the present invention, the present invention may be applied to a rotary etching apparatus.

As explained so far, the present invention has advantages as follows: (1) a substrate is dried fast; (2) drying fluid is indirectly injected to a substrate to entirely maintain a laminar flow and to uniformly maintain a concentration distribution of the drying fluid; (3) an indirect injection nozzle faces upwardly to prevent foreign substances from dropping on a substrate; (4) a substrate is protected from external contaminants when the substrate is dried; (5) watermarks made while drying a substrate are minimized; (6) a substrate is prevented from coming in contact with air; (7) concentration and temperature change of fluid supplied to dry a substrate is minimized; and (8) a drying efficiency of the central portion of a substrate is enhanced.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A substrate treating apparatus comprising:
   a substrate support unit with a chuck on which a substrate is loaded;
   a bottom chamber having an open top and configured to surround a circumference of the chuck;
   a top chamber configured to open or close the top of the bottom chamber such that the substrate is dried while the top chamber is sealed from an external environment;
   a direct injection nozzle member installed at the top chamber to inject fluid directly to the substrate while the top of the bottom chamber is closed; and
   an indirect injection nozzle member installed at an edge of the top chamber to inject fluid to a center of the top chamber such that the fluid is indirectly injected to the substrate;
   wherein the top chamber comprises a flow induction member configured to guide a flow of fluid injected from the indirect injection nozzle member to the center of a top surface of the top chamber such that the fluid reaches first a center of the substrate, the flow induction member comprising a conic guide protrusion protruded toward the center of the substrate from the center of the top surface of the top chamber.

2. The substrate treating apparatus of claim 1, wherein the direct injection nozzle member is movable to change fluid-injection points.

3. The substrate treating apparatus of claim 1, wherein the direct injection nozzle member comprises:
   non-linear first and second nozzles disposed on a bottom surface of the top chamber and each having a drying fluid injection hole at one end; and
   a shaft connected to another end of the respective first and second nozzles and having a passage through which fluid is supplied to the first and second nozzles.

4. The substrate treating apparatus of claim 3, wherein the direct injection nozzle member further comprises:
   a first driver for rotating the shaft to change fluid-injection points of the first and second nozzles.

5. The substrate treating apparatus of claim 3, wherein the direct injection nozzle member further comprises:
   a second driver for ascending or descending the shaft to change fluid-injection heights of the first and second nozzles.

6. The substrate treating apparatus of claim 3, wherein an accommodating space in which the first and second nozzles of the direct injection nozzle member stay is defined at the edge of the top chamber.

7. The substrate treating apparatus of claim 6, wherein the accommodating space is located outside an edge of the substrate.

8. The substrate treating apparatus of claim 6, wherein the first nozzle is configured to inject fluid for cleaning a substrate and the second nozzle is configured to inject fluid for drying the substrate.

9. The substrate treating apparatus of claim 3, wherein each of the first and second nozzles is supplied as an arc shape and stays in an accommodating space located at the edge of the top chamber to suppress interference for other processes.

10. The substrate treating apparatus of claim 1, wherein the top chamber further comprises:

an annular space defined to guide the drying fluid injected from the indirect injection nozzle member to the center of the top chamber;
a central aperture through which the drying fluid collected at the center of the top chamber along the annular space are drained to the substrate; and
a guide surface for guiding the drying fluid drained through the central aperture to be gradually diffused from the center to the edge of the substrate.

11. The substrate treating apparatus of claim 1, wherein the indirect injection nozzle member is installed at the edge of the top chamber to arrange as a ring shape.

12. The substrate treating apparatus of claim 11, wherein the indirect injection nozzle member is installed to inject fluid to the guide protrusion.

* * * * *